United States Patent
Sin

(10) Patent No.: US 6,513,250 B2
(45) Date of Patent: Feb. 4, 2003

(54) MICRO POSITIONING DEVICE WITH SHARED ACTUATORS

(75) Inventor: Jeongsik Sin, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 09/904,755

(22) Filed: Jul. 13, 2001

(65) Prior Publication Data

US 2002/0004991 A1 Jan. 17, 2002

Related U.S. Application Data

(60) Provisional application No. 60/218,164, filed on Jul. 14, 2000.

(51) Int. Cl.$^7$ .................................................. G01B 5/00
(52) U.S. Cl. .......................................... 33/1 M; 33/645
(58) Field of Search ............................... 33/1 M, 1 AA, 33/1 BB, 568, 573, 645; 310/328, 329

(56) References Cited

U.S. PATENT DOCUMENTS

| | | | | |
|---|---|---|---|---|
| 3,744,891 A | * | 7/1973 | Dennis et al. | 33/1 M |
| 5,005,298 A | * | 4/1991 | Nagasawa et al. | 33/568 |
| 5,013,958 A | * | 5/1991 | Ohnishi et al. | 310/328 |
| 5,351,412 A | * | 10/1994 | Furuhata et al. | 33/573 |
| 5,836,080 A | * | 11/1998 | Inagaki et al. | 33/1 M |
| 5,978,172 A | * | 11/1999 | Nayak et al. | 360/78.02 |
| 5,994,820 A | * | 11/1999 | Kleindiek | 310/328 |
| 6,008,610 A | * | 12/1999 | Yuan et al. | 318/592 |
| 6,408,526 B1 | * | 6/2002 | Montesanti et al. | 33/1 M |

* cited by examiner

Primary Examiner—G. Bradley Bennett
(74) Attorney, Agent, or Firm—James Magee, Jr.

(57) ABSTRACT

A device for micro positioning of small objects using an actively generated friction force field. Positioning is achieved by sequentially holding the object by a gripper or holding means while moving the gripper on a manipulation surface by means of piezoelectric actuators.

6 Claims, 4 Drawing Sheets

MICRO POSITIONING DEVICE WITH SHARED ACTUATORS

This application claims the benefit of provisional application No. 60/218,164 filed Jul. 14, 2000.

This invention relates to movement and control of objects and more particularly to micro positioning devices and a method which can be used in parallel precision assembly or parts feeding. Further, this invention is directed to micro manipulation of objects using a friction force field. The manipulation and positioning method is described in a publication entitled Micromanipulation Using a Friction Force Field, published in the proceedings of 20001 IEEE, International Conference on Robotics & Automation, Seoul, Korea, May 21–26, 2001, which is incorporated herein by reference.

The current lack of manufacturing techniques for very high volume handling of small objects presents a technology barrier to commercial success in various fields of micro systems technology (MST) such as micro electromechanical systems (MEMS). A fundamentally new approach to automated massive parallel manipulation of small-sized objects or parts is needed and is provided by this invention.

Mass production of miniature components such as integrated circuits, micro electromechanical systems (MEMS), and the like, requires fundamental innovations in parts handling. Components of such systems are built using micro fabrication processes derived from VLSI technology, which allows the manufacture and handling of thousand or millions of components in parallel. The active surface device disclosed herein uses a new approach to automated object manipulation. Instead of handling a single object directly, for example, with a robot gripper, an active surface device, such as a pneumatic surface device can be used to manipulate multiple objects simultaneously. Such an automation device permits parallel and distributed, sensing and actuation, and is particularly attractive for handling batch micro fabricated objects, the large numbers and small dimensions of which preclude conventional pick and place operations with robot grippers. Accordingly, there is a particular need for methods and equipment to provide such capability.

BACKGROUND OF THE INVENTION

Micro assembly, which involves high-precision handling and assembly of objects, is an important technology. Among the various micro assembly techniques, assembly using a positioning device is a conventional and reliable approach. In that approach, the fine resolution of the positioning device is a critical requirement for an object's successful manipulation and assembly.

Commercial positioning systems now provide high resolution and repeatability. There are conventional XY positioning tables, articulate joint robots, and some parallel mechanisms. Prototype systems have been described which use stepping motors and inertial drives to obtain sub-micrometer motion resolution. It has been generally observed that handling of smaller parts requires larger machines. Also there are actuator arrays, which usually consist of a regular grid of motion pixels that can generate force or motion in a specific direction. The actuation can be provided by a variety of methods such as electrostatic forces, air jets, thermo-bimorph or magnetic actuation.

Illustrative precision positioning devices of the prior art include U.S. Pat. No. 5,351,412 which describes a pair of aluminum electrodes on a piezoelectric element bonded on a silicon wafer. Voltages were applied to the aluminum electrodes and phase difference causes vertical motion of PZT which make rotational and horizontal motion of electrode pin. U.S. Pat. No. 6,008,610 describes a high position control apparatus for fine stages carried by coarse stage. By adjusting the fine stages, any synchronous errors between the fine stages during scanning may be dynamically corrected. U.S. Pat. No. 5,994,820 discloses an electromechanical positioning unit formed as an inertial drive to position objects with atomic scale positioning precision and with displacement ranges up to centimeters. In U.S. Pat. No. 5,978,172, a voice coil driven positioning device is provided for positioning the magnetic head of a tape drive relative to the tape of a removable tape cartridge.

DESCRIPTION OF THE INVENTION

Piezoelectric (PZT) actuators can be used for precision manipulation with enhanced range in this invention. They have an outstanding resolution and fast response, therefore these actuators have been used in many applications such as the optical alignment process, biomedical object manipulation, and miniature robotics. A main drawback of the PZT actuator is its limited working distance. Since a PZT actuator can currently generate a maximum of about 0.1 about % strain, the usual working distance ranges from about 10 to about 100 microns (micrometer). This is generally too short a distance for the flexible manipulation of an object. If the positioning device could provide a relatively large working range that allowed flexible handing of the micro-object as well as fine resolution within a miniaturized physical scale, it would be very attractive for flexible micro-object handling.

In addition, current demand in the manufacturing of microsystem devices requires reduced cost and reduced cycle time. Serialized manipulation and assembly processes are inefficient in providing the required throughput, so parallel processes are highly preferred. The conventional manipulation scheme is difficult to adapt to parallel processing because of its physical dimension, which is generally much bigger than the components being handled. If a positioning device can provide the capability to manipulate multiple objects within a relatively small physical dimension along with a cost-effective configuration, it will have a great advantage over the more traditional serialized assembly process.

The present invention provides mechanisms and methods for using piezoelectric actuators for multi-object manipulation with an enhanced working range and degrees of freedom while maintaining the inherent fine resolution of the actuator. Positioning of multiple objects is carried out simultaneously by shared actuators. The device consists of two piezoelectric actuators driven for linear motion in X and Y directions, and a two dimensional array of object-holding heads, which can apply force such as pneumatic suction force to the objects being manipulated. The two actuators move the object-holding heads as required.

The present invention addresses the need for high accuracy combined with a reasonable large dynamic range, parallel processing, and low system cost through the use of a few actuators.

The present invention is directed to an active surface device for manipulation and positioning of an object on a surface, comprising a surface on which to support an object, at least one movable gripper means at the surface to grip the object and move the object to another position on the surface, means to release the object from the grip of the movable griper, fixed gripper means at the surface to, including means to grip the object and restrain movement of the object during movement of the movable gripper means to a position for further movement of the object, a pair of actuator means, individually adapted to move the movable gripper means in X and Y directions.

The term "active surface" as used herein means a surface comprising means for gripping, holding and, moving an object about on the surface. An active surface device includes such a surface and all of the necessary components to accomplish movement of an object on the surface.

The basic principles of the invention are described herein. In general for convenience, the description is given in terms of a suction force being used to hold the object on the movable or fixed holding heads. For motion in a given direction, e.g. the x-direction, there are two sets of grippers or object-holding heads that can hold onto an object on a flat surface. One set is fixed relative to the surface on which the object is to be moved or positioned. The other set can be moved by an actuator such as a piezoelectric actuator relative to this surface, this set is used to move the object step by step.

BRIEF DESCRIPTION OF THE DRAWINGS

The invention will be more thoroughly understood when considered in light of the accompanying drawings.

DETAILED DESCRIPTION OF THE DRAWINGS

Figure 1:
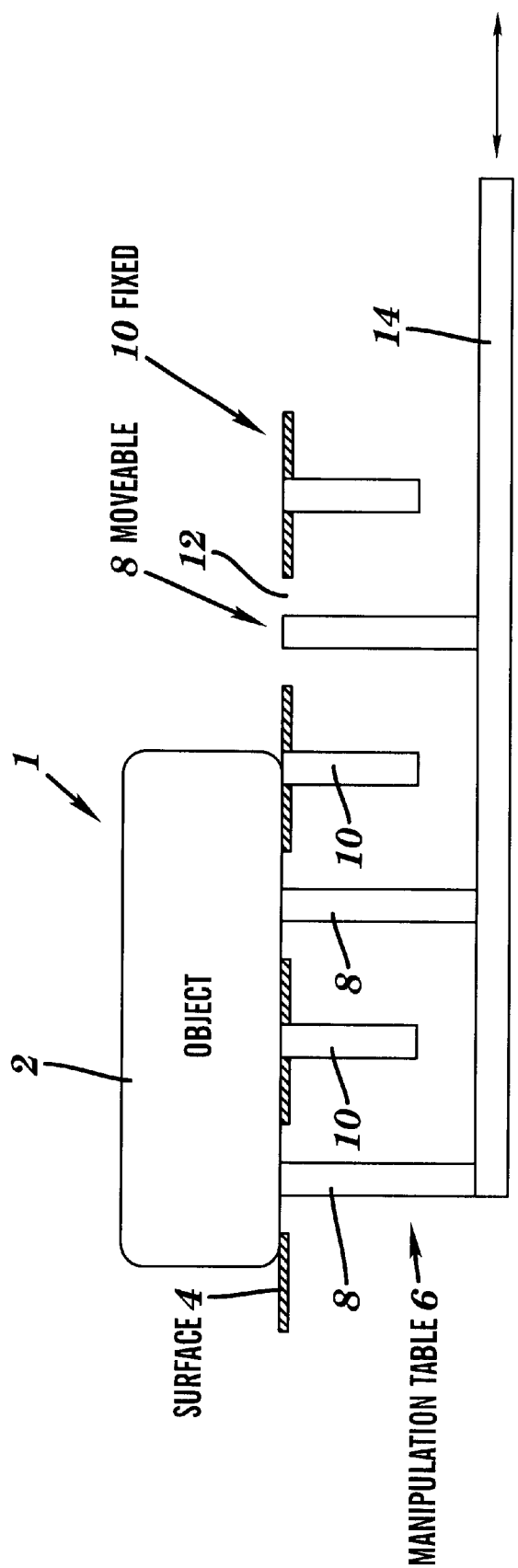
FIG. 1 is a simplified schematic cross section of an embodiment of the invention.

FIG. 1 is a simplified schematic cross section of a pneumatic active surface device 1 which illustrates the concept of the invention. The object to be moved 2 rests on the surface 4 of manipulation table 6. Table 6 is provided with an array of pneumatic holders or grippers 8 and 10. The pneumatic holders apply a suction force to the object 2. Heads 8 are movable within the space of apertures 12. Heads 10 are fixed relative to surface 4. Actuator 14 moves heads 8 as indicated by the arrow. The holding heads or grippers are activated to hold the object by application of suction from a vacuum system, not shown.

In order to move an object placed on the surface the following steps are performed:

1. The fixed grippers 10 are activated with vacuum to hold onto the object 2, while movable grippers 8 are not active.
2. The actuator 14 moves grippers 8 to one extreme position, e.g., to the far right.
3. The movable grippers 8 are activated and hold onto the object 2 while grippers 10 are deactivated to release the object.
4. The actuator moves the grippers 8 to the other extreme position thereby moving the object.
5. The procedure is repeated (steps 1–4) until the object is close to the desired position after which partial steps can be applied.

This invention provides a method or process for positioning an object on a surface which comprises providing a surface having an array of holding heads which are fixed with respect to the surface and an array of holding heads which are movable in X and Y directions by a pair of piezoelectric actuators. A holding force is selectively applied to the holding heads so that they grip or hold the object for movement or, in the case of the fixed holding heads, to prevent movement. Control means such as a computer is provided to activate the holding force and operate the actuators. In the practice of this method, the object at it's initial position is gripped, such as by suction, by at least one movable holding head the actuators move the holding head and the attached object to a second position on the surface. The grip is released and a fixed holding head grips the object to hold it in the second position while the movable holding head is returned to it's initial position where it may again grip a different place on the object or a different object. The fixed holding head is deactivated to release the object and the movable holding head is activated and moved as before The time to hold and release the objects from the holding heads is is synchronized to the repeated actuation cycle of the actuators so that the combination makes the objects move in 3 DOF (X, Y, and θ). The way of moving an object is similar to a person moving a piece of paper across a table top by pushing it step by step with a finger while holding the hand stationary relative to the table. Multiple objects can be manipulated simultaneously as the grippers are addressed individually, so that when one object is held to the surface by a fixed gripper, a movable gripper can move another object.

Figure 2:
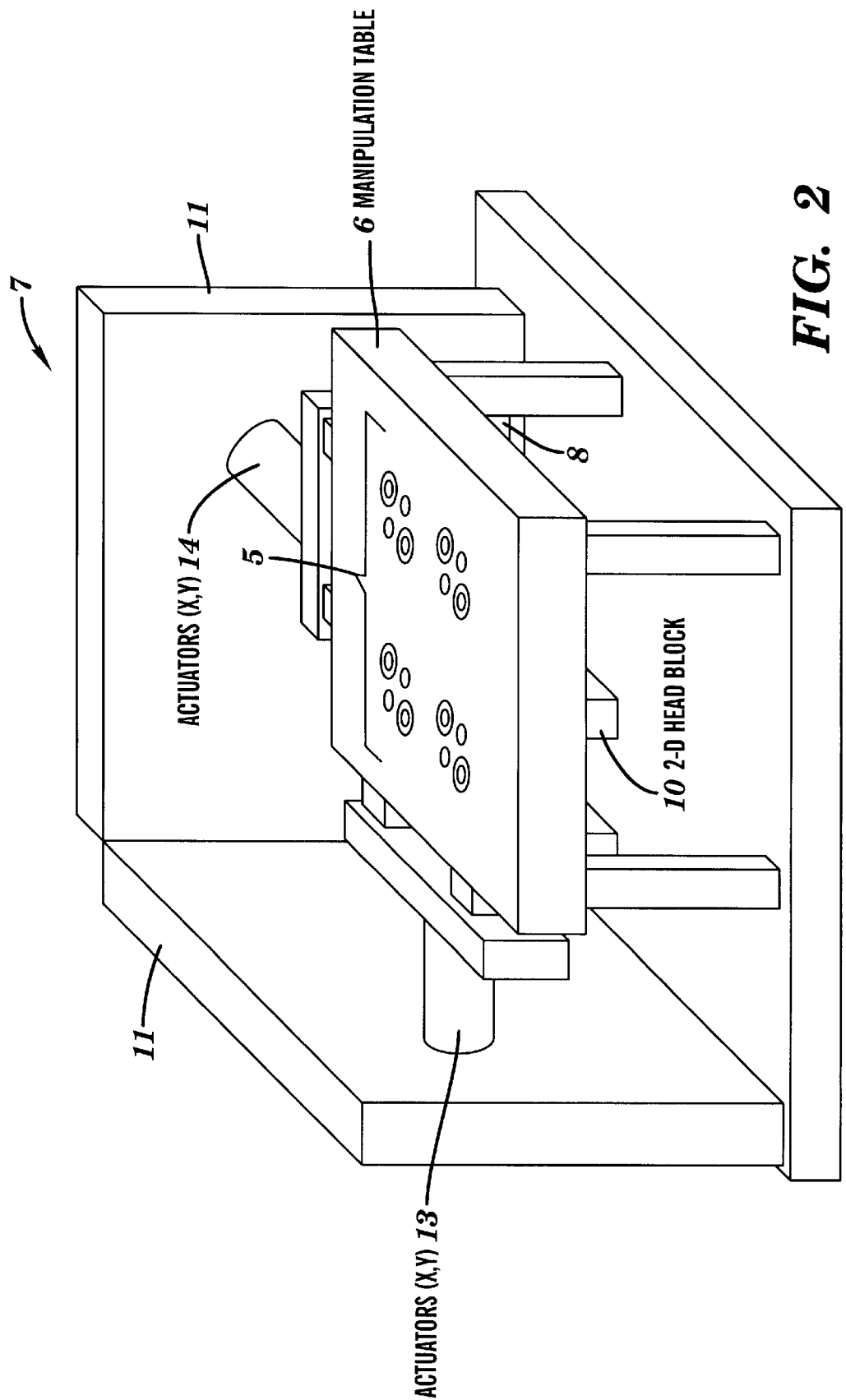
FIG. 2 is schematic view of a device
Figure 3:
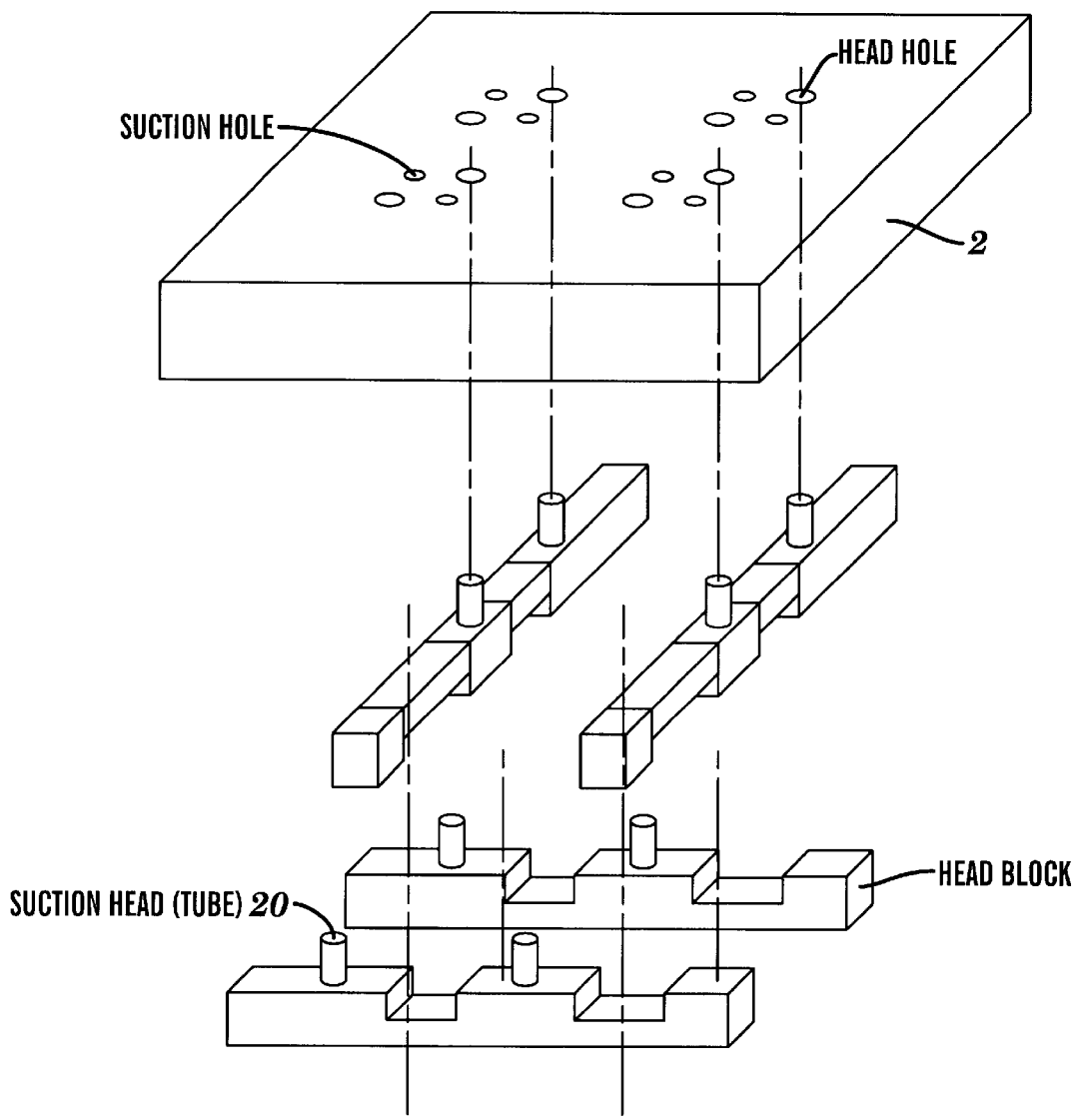
FIG. 3 is an exploded view of the device of FIG. 2.

Referring now to FIGS. 2 and 3, the device 1 comprises a manipulation table 2, two piezoelectric actuators 13 and 14 for X and Y directional motion, and two head blocks or gripper blocks 8 and 10 associated with actuators 13 and 14 respectively. Table 6 is provided with an array of apertures to receive capillary size grippers or holding heads, shown collectively as 5. For convenience, this device is described as a pneumatic device in which holding force is provided by suction from a vacuum system which is not shown. Each holding head block 8 and 10 consists of a one-dimensional member which provide movement in the X or Y direction. The two actuators 13 and 14 are mounted on a support or frame 10 for linear motion in X and Y directions and each actuator is attached to one holding head. The holding heads for X and Y direction are mounted on the active end of each X and Y actuators. In this assembly, there is some tolerance between X direction head blocks and Y direction head blocks so that the head blocks 8 serving each direction do not interfere with each other when they are actuated. Each one dimensional head block has a row of gripper or object-holding heads each consisting of a small suction tube. The open or upper end of the suction tube will contact the object to be manipulated and apply suction force to it when activated. The other end of the tube is connected to a two-way pneumatic solenoid valve, not shown, which switches between suction line and ambient pressures. The manipulation table sits on the top of the two sets of head blocks and is fixed to the frame. The table is provided with the apertures described above through which the suction tubes or holding heads access the surface of the table 6. The holding heads are leveled with the table surface. The fixed set of suction holes is firmly attached to the table. These suction holes are also connected to a two-way pneumatic solenoid valves which switches between suction line and ambient pressure.

Figure 4:
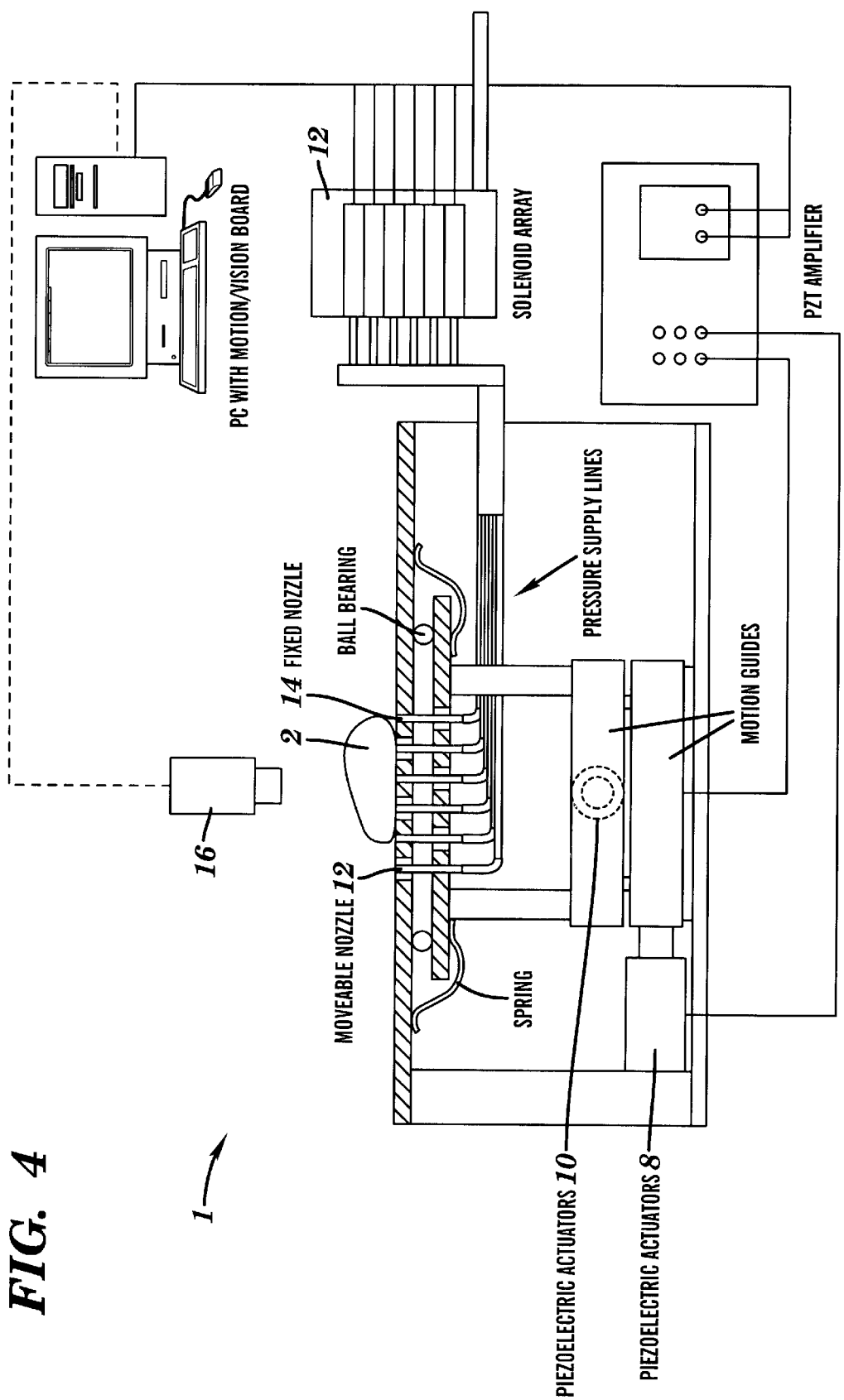
FIG. 4 is a schematic cross section of an embodiment of the invention.

FIG.4 illustrates schematically the object manipulation device 1 and associated operational systems which include an array of solenoid valves 12 for activation and deactivation of the grippers or holding means. An amplifier 6 is used to operate the PZT actuators 8 and 10. The grippers are shown as movable nozzle 12 indicated by the wider apertures in the positioning surface 16 and fixed nozzles 14 which are indicated as fitting snugly into the smaller apertures.

Camera 16 is positioned to view the object 2 as it is moved across the table.

The electrical system is composed of an amplifier for the piezoelectric actuators, a switching circuit for pneumatic valves and a controller. The controller is a microprocessor-driven dedicated device, which provides PZT actuation analogue signal, solenoid driving digital output signal and a computer interface.

The computer interface unit in the controller communicates with an external computer to report its current state of actuator and accept position commands. If the controller receives positioning commands from the external computer, the commands are interpreted to generate a PZT driving analog signal that is sent to the amplifier driving the actuator. This signal is a sinusoidal signal that allows the actuator to generate repeated motions with a given frequency. The signal has some time delay duration at each highest and lowest level so that the synchronized solenoid valve can be activated or deactivated during this delay. For example, if the goal position is given in the actuator pushing direction, the controller starts generating sinusoidal signal and the PZT actuator starts generating motion responding to the driving signal. The movable holding head holds the object while the actuator moves forward, and releases the object when the actuator retracts. The fixed holding head on the manipulation table holds while the actuator retracts and releases when it moves forward. This causes the object to remain at that position during the actuator return stroke. The combined action will push the moving block in the actuator push direction. These serialized actions will only generate movement when the actuator moves to push direction and eventually results in movement over the actuator working distance.

When the object approaches the goal position, the actuator can use its resolution for fine positioning. In two dimensional translational motions such as X and Y direction, the two actuators can be actuated taking turns. If a fixed holding head holds the object while a movable holding head is activated for transnational motion, the result will be rotational motion. With two actuators, the system can provide 3 degrees of freedom motion.

In addition, since the holding heads can be deployed as two-dimensional arrays actuated with shared actuators, multiple objects can be positioned simultaneously.

Other types of actuators can be used such as electromagnetic or electrostatic instead of the piezoelectric actuator used in this invention. The holding head can also be made of another type such as electromagnetic or electrostatic instead of the pneumatic suction force. They can be of different configuration. The array of 1-D head block can be designed as 2-dimensional plate and it can be mounted on a precision X-Y positioning table which has conventional configuration of actuators and linear motion guide. The invented positioning concept may be fabricated as a MEMS device which has movable suction heads and fixed suction heads on a silicone wafer so that it can handle very small objects.

What is claimed:

1. An active surface device for manipulation and positioning of an object on a surface, comprising a surface on which to support an object, at least one movable holding head means at the surface to grip the object and move the object from a first position to a second position on the surface, means to release the object from the grip of the movable holding head, fixed holding head means at the surface to grip the object and restrain movement of the object during movement of the movable holding head means to the first position for further movement of the object, a pair of actuator means adapted to move the movable gripper means in an X and Y directions.

2. An active surface device according to claim 1 for manipulation and positioning of objects which comprises a manipulation table, an array of fixed grippers associated with the table, an array of movable grippers associated with the table, means for selectively activating the fixed and the movable grippers to hold or release the object located on the surface of the table, actuator means for moving the movable grippers while at least one movable gripper is holding the object.

3. A pneumatic active surface device according to claim 1 for manipulation and positioning of objects which comprises a manipulation table, an array of pneumatic fixed grippers associated with the table, an array of pneumatic movable grippers associated with the table, means for selectively activating the fixed and the movable grippers to hold or release the object located on the surface of the table by vacuum force, piezoelectric actuator means for moving the movable grippers while at least one movable gripper is holding the object.

4. A device according to claim 1 in which the actuator means comprise a pair of piezoelectric actuators for motion at right angles to each other.

5. A device according to claim 1 having an array of movable and fixed holding heads for sequential and parallel movement of the single object or multiple object from an initial position to a goal position.

6. A method for moving an object from a first position on a surface to a second position on the surface which comprises (1) providing a surface having an array of fixed and movable suction heads, (2) providing a pair of piezoelectric actuators for moving the movable suction heads in X and Y directions, (3) applying a suction force to a movable suction head in contact with the object thereby holding the object, (4) operating the actuators to move the movable suction head and the object from a first to a second position, (5) releasing the object from the movable suction head, (6) applying suction to a fixed suction head to hold the object in the second position, (7) operating the actuators to move the movable suction head back to the first position, and repeating steps 3 through 7 move the object to a final position.

* * * * *